(12) United States Patent
Inoue et al.

(10) Patent No.: US 9,989,215 B2
(45) Date of Patent: Jun. 5, 2018

(54) FLUORESCENCE LIGHT SOURCE APPARATUS

(71) Applicant: Ushio Denki Kabushiki Kaisha, Tokyo (JP)

(72) Inventors: Masaki Inoue, Tokyo (JP); Seiji Kitamura, Tokyo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 0 days. days.

(21) Appl. No.: 15/561,565

(22) PCT Filed: Feb. 23, 2016

(86) PCT No.: PCT/JP2016/055163
§ 371 (c)(1),
(2) Date: Sep. 26, 2017

(87) PCT Pub. No.: WO2016/158089
PCT Pub. Date: Oct. 6, 2016

(65) Prior Publication Data
US 2018/0080629 A1     Mar. 22, 2018

(30) Foreign Application Priority Data

Mar. 31, 2015 (JP) ................................ 2015-071277

(51) Int. Cl.
*F21V 9/30* (2018.01)
*F21V 9/16* (2006.01)
(Continued)

(52) U.S. Cl.
CPC ............... *F21V 9/30* (2018.02); *C23C 14/16* (2013.01); *C23C 14/30* (2013.01); *C23C 14/34* (2013.01);
(Continued)

(58) Field of Classification Search
CPC . F21V 9/30; F21V 29/505; F21V 7/22; F21V 9/16; F21V 5/10; F21V 7/26;
(Continued)

(56) References Cited

U.S. PATENT DOCUMENTS

2008/0025027 A1* 1/2008 Lim ................... C09K 11/7701
362/260
2011/0149549 A1* 6/2011 Miyake ..................... F21V 7/22
362/84

(Continued)

FOREIGN PATENT DOCUMENTS

| JP | 2011-129354 A | 6/2011 |
| JP | 2014-179231 A | 9/2014 |

(Continued)

OTHER PUBLICATIONS

International Search Report issued in PCT/JP2016/055163; dated May 24, 2016.

(Continued)

*Primary Examiner* — Bao Q Truong
(74) *Attorney, Agent, or Firm* — Studebaker & Brackett PC

(57) ABSTRACT

The present invention has as its object the provision of a fluorescence light source apparatus which has high reliability without a drop in reflectance over a long period of time. The fluorescence light source apparatus of the present invention includes a fluorescent plate that emits fluorescence under excitation light and has a front surface serving as an excitation light incident surface, a reflection layer that is disposed on a back surface side of the fluorescent plate, and a heat dissipation substrate, wherein a sealing layer covering a back surface and a peripheral side surface of the reflection layer is provided in close contact with a peripheral area of the back surface of the fluorescent plate via an adhesion layer, and a diffusion prevention layer formed by nickel (Continued)

plating is provided on the heat dissipation substrate via a bonding member layer.

4 Claims, 3 Drawing Sheets

(51) Int. Cl.
  *F21V 29/505* (2015.01)
  *C23C 14/16* (2006.01)
  *C23C 14/34* (2006.01)
  *C23C 14/30* (2006.01)
  *F21V 7/22* (2018.01)
(52) U.S. Cl.
  CPC ............... *F21V 7/22* (2013.01); *F21V 9/16* (2013.01); *F21V 29/505* (2015.01)
(58) Field of Classification Search
  CPC ... F21V 7/30; F21V 9/32; F21V 13/08; C23C 14/16; C23C 14/30; C23C 14/34; F21K 9/64; F21Y 2105/00
  See application file for complete search history.

(56) References Cited

U.S. PATENT DOCUMENTS

| | | | | |
|---|---|---|---|---|
| 2013/0056775 A1* | 3/2013 | Kawakami | ............... | F21V 9/16 257/98 |
| 2016/0061391 A1* | 3/2016 | Inoue | ................... | H01L 33/505 362/84 |

FOREIGN PATENT DOCUMENTS

| | | |
|---|---|---|
| JP | 2014-192127 A | 10/2014 |
| JP | 2014-194895 A | 10/2014 |
| WO | 2014/065051 A1 | 5/2014 |

OTHER PUBLICATIONS

An Office Action; "Decision to Grant a Patent," issued by the Japanese Patent Office on Sep. 6, 2016, which corresponds to Japanese Patent Application No. 2015-071277.

* cited by examiner

FLUORESCENCE LIGHT SOURCE APPARATUS

TECHNICAL FIELD

The present invention relates to a fluorescence light source apparatus.

BACKGROUND ART

Fluorescence light source apparatuses configured to irradiate a fluorescent plate with laser light as excitation light and emit fluorescence from the fluorescent plate have been conventionally known.

As illustrated in FIGS. 4 and 5, some fluorescence light source apparatuses include a fluorescent plate 51 that contains a phosphor for emitting fluorescence under excitation light from an excitation light source 11 such as a semiconductor laser and has a front surface (in FIG. 4, top surface) serving as an excitation light incident surface, and a heat dissipation substrate 52 that is provided on a back surface (in FIG. 4, bottom surface) side of the fluorescent plate 51 (for example, see Patent Literature 1). In the fluorescence light source apparatus, the back surface of the fluorescent plate 51 is provided with a reflection layer and the like, and thus has a reflection function. The reflection layer may preferably be made of a metal having a high light reflection property. Aluminum (Al), silver (Ag) or the like is used as the metal constituting the reflection layer. A bonding member layer 53 made of a metal such as a solder is interposed between the reflection layer provided on the fluorescent plate 51 and the heat dissipation substrate 52. The fluorescent plate 51 is bonded onto the heat dissipation substrate 52 by the bonding member layer 53.

CITATION LIST

Patent Literature

Patent Literature 1: Japanese Patent Application Laid-Open No. 2011-129354

SUMMARY OF INVENTION

Technical Problem

However, the fluorescence light source apparatus including the reflection layer provided on the fluorescent plate causes a problem that the reflectance of the reflection layer drops due to surface deterioration by oxidation, sulfuration and the like. When the fluorescent plate and the heat dissipation substrate are bonded in the manufacturing steps of the fluorescence light source apparatus and when the fluorescence light source apparatus is in operation, the bonding portion becomes high in temperature. This causes a problem that low-reflectance substances included in the bonding member diffuse into the reflection layer with a drop in reflectance.

The problem of such a drop in the reflectance of the reflection layer due to surface deterioration and the diffusion of the metal included in the bonding member can occur in any of the cases in which neither a protective layer for weather resistance nor a diffusion prevention layer for the substances included in the bonding member is provided on the reflection layer, either one of the protective and diffusion prevention layers is provided, and both are provided but without sufficient adhesion of the protective layer. The problem of the drop in the reflectance of the reflection layer is significant if silver (Ag) or a silver alloy mainly containing silver is used as the reflection layer and a tin (Sn)-containing metal such as a solder is used as the bonding member.

The present invention has been made in view of the foregoing circumstances and has as its object the provision of a fluorescence light source apparatus that has high reliability without a drop in reflectance over a long period of time.

Solution to Problem

A fluorescence light source apparatus according to the present invention is a fluorescence light source apparatus including a fluorescent plate that emits fluorescence under excitation light and has a front surface serving as an excitation light incident surface, a reflection layer that is disposed on a back surface side of the fluorescent plate, and a heat dissipation substrate, wherein a sealing layer covering a back surface and a peripheral side surface of the reflection layer is provided in close contact with a peripheral area of the back surface of the fluorescent plate via an adhesion layer, and a diffusion prevention layer formed by nickel plating is provided on the heat dissipation substrate via a bonding member layer.

In the fluorescence light source apparatus according to the present invention, the diffusion prevention layer may preferably have a thickness of not smaller than 1 μm and not greater than 3 μm.

In the fluorescence light source apparatus according to the present invention, the diffusion prevention layer may preferably be a plating layer formed by using a nickel sulfamate plating bath.

In the fluorescence light source apparatus according to the present invention, a stress relaxation layer may preferably be provided between the diffusion prevention layer and the sealing layer.

Advantageous Effects of Invention

According to the fluorescence light source apparatus of the present invention, the diffusion prevention layer formed by nickel plating is provided on the heat dissipation substrate via the bonding member layer. This can prevent the reflectance of the reflection layer from dropping due to diffusion of a constituent material (bonding member) of the bonding member layer into the reflection layer. Even if a tin-containing metal is used as the constituent material of the bonding member layer and a silver reflection film or a silver alloy reflection film mainly containing silver is used as the reflection layer, a drop in the reflectance of the reflection layer due to diffusion of tin can thus be prevented.

The sealing layer covering the back surface and the peripheral side surface of the reflection layer is provided on the back surface side of the fluorescent plate, in close contact with the peripheral area of the back surface of the fluorescent plate via the adhesion layer. A sealing structure of the reflection layer is thereby formed. Since the reflection layer is not exposed to the ambient atmosphere such as the air, a drop in the reflectance of the reflection layer due to surface deterioration by oxidation, sulfuration and the like can be prevented.

According to the fluorescence light source apparatus of the present invention, high reliability can thus be obtained without a drop in reflectance over a long period of time.

DESCRIPTION OF EMBODIMENTS

An embodiment of a fluorescence light source apparatus according to the present invention will be described below.

Figure 1:
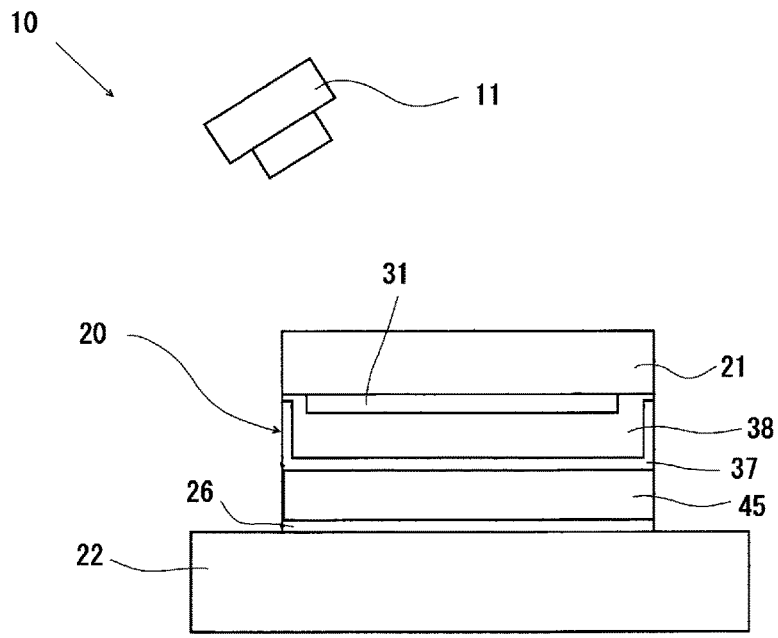
FIG. 1 is an explanatory diagram illustrating an outline of an example of a configuration of a fluorescence light source apparatus according to the present invention.
Figure 2:
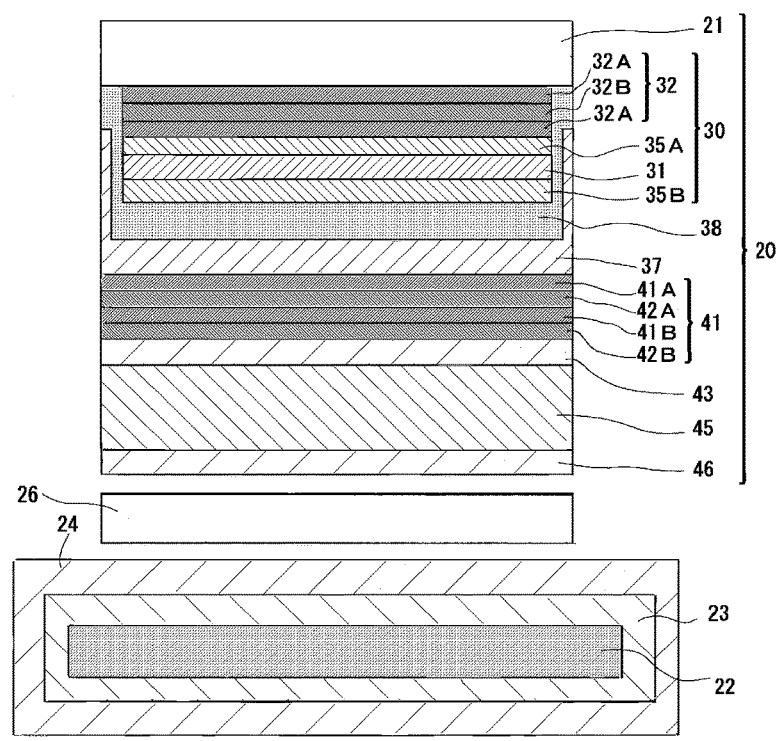
FIG. 2 is an explanatory exploded view illustrating a specific configuration of a fluorescence emission member and a heat dissipation substrate in the fluorescence light source apparatus of FIG. 1.

FIG. 1 is an explanatory diagram illustrating an outline of an example of a configuration of the fluorescence light source apparatus according to the present invention. FIG. 2 is an explanatory exploded view illustrating a specific configuration of a fluorescence emission member and a heat dissipation substrate in the fluorescence light source apparatus of FIG. 1.

As illustrated in FIG. 1, the fluorescence light source apparatus 10 includes an excitation light source 11 which includes a semiconductor laser, for example, and a fluorescence emission member 20 which includes a fluorescent plate 21 for emitting fluorescence under excitation light from the excitation light source 11. The excitation light source 11 and the fluorescence emission member 20 are disposed at a distance from each other. The fluorescence light source apparatus 10 also includes a heat dissipation substrate 22 which is provided on a back surface side (in FIGS. 1 and 2, bottom surface side) of the fluorescence emission member 20.

In the illustrated example, the fluorescence emission member 20 is opposed to the excitation light source 11 in an orientation oblique to an optical axis of the excitation light source 11.

The fluorescence emission member 20 is configured so that a front surface (in FIGS. 1 and 2, top surface) of the fluorescent plate 21 of flat plate shape serves as an excitation light incident surface and a fluorescence emission surface.

The fluorescence emission member 20 is configured so that a back surface (in FIGS. 1 and 2, bottom surface) of the fluorescent plate 21 is opposed to and bonded to a front surface (in FIGS. 1 and 2, top surface) of the heat dissipation substrate 22 of flat plate shape. A bonding member layer 26 of flat plate shape is then formed between the heat dissipation substrate 22 and the fluorescence emission member 20. In other words, the fluorescence emission member 20 and the heat dissipation substrate 22 are bonded by the bonding member layer 26.

The fluorescence emission member 20 is disposed so that the front surface of the fluorescent plate 21 is opposed to the excitation light source 11.

The fluorescent plate 21 is a plate-like member containing a phosphor which emits fluorescence when excited by excitation light.

The fluorescent plate 21 may preferably be a plate-like member including a phosphor and a metal oxide, or more specifically, a sintered body of a mixture of the phosphor and the metal oxide. The fluorescent plate 21 may preferably be a plate-like member in which portions made of metal oxide particles (hereinafter, also referred to as "metal oxide portions") are mixed with portions made of phosphor particles (hereinafter, also referred to as "phosphor portions"), and from the front surface of which metal oxide portions are exposed.

Since the fluorescent plate 21 includes the phosphor and the metal oxide, i.e., includes the metal oxide portions and the phosphor portions, and the metal oxide portions are exposed from the front surface, high adhesion to the constituent members of the fluorescence emission member 20 (in the illustrated example, a reflection stack 30 and an adhesion layer 38 to be described later) stacked in contact with the fluorescent plate 21 is provided.

Since the fluorescent plate 21 includes the phosphor and the metal oxide, the excitation light entering the inside of the fluorescent plate 21 and fluorescence are guided in a controlled manner. This reduces an emission area in the fluorescence emission surface and improves emission luminance. Inside the fluorescent plate 21, the traveling direction of excitation light that enters a phosphor portion and is not absorbed is changed by the interface between the phosphor portion and a metal oxide portion. Part of the excitation light that enters the phosphor portion and is not absorbed thus travels toward another phosphor portion. This increases the optical path length for converting the excitation light into fluorescence, and the probability for the excitation light to be absorbed into a phosphor portion increases. As a result, the excitation light entering the inside of the fluorescent plate 21 can be effectively used and converted into fluorescence with high efficiency. In addition, the traveling direction of fluorescence emitted from a phosphor portion is changed by the interface between other phosphor portions and metal oxide portions. This suppresses confinement of fluorescence within the fluorescent plate 21. As a result, the fluorescence emission member 20 can effectively use fluorescence occurring in the fluorescent plate 21 and emit the fluorescence to outside with high efficiency.

A polycrystalline phosphor is used as the phosphor of the fluorescent plate 21.

Since the phosphor constituting the fluorescent plate 21 is a polycrystalline phosphor, the fluorescent plate 21 has high thermal conductivity. Heat occurring in the fluorescent plate 21 due to the irradiation with the excitation light is thus efficiently dissipated, whereby high temperature of the fluorescent plate 21 is suppressed. As a result, a decrease in the light amount of fluorescence due to the occurrence of temperature quenching in the phosphor of the fluorescent plate 21 can be suppressed.

Here, the polycrystalline phosphor constituting the fluorescent plate 21 can be obtained, for example, in the following manner. Initially, raw materials such as a base material, an activator, a metal oxide and a baking auxiliary are ground in a ball mill or the like to obtain submicron or smaller, raw material fine particles. Next, the raw material fine particles are used to form a molded article by, for example, slip casting, followed by sintering. The sintered article is then subjected to hot isotropic pressing to obtain a polycrystalline phosphor having a porosity of lower than or equal to 0.5%, for example.

The phosphor constituting the fluorescent plate 21 may preferably be an inorganic phosphor, or more specifically, one made of a complex oxide doped with a rare earth element as a light emission ion (activator).

For example, the fluorescent plate 21 has a phosphor content of 20% to 80% by mass.

For example, the phosphor particles have a particle size (average particle size) of 1 to 10 μm.

From the viewpoint of a heat dissipation property (heat conductivity), adhesion to the phosphor, etc., aluminum oxide ($Al_2O_3$) or the like is used as the metal oxide of the fluorescent plate 21.

The fluorescent plate 21 having such a configuration can be manufactured, for example, by mixing phosphor particles having appropriate particle sizes with aluminum oxide ($Al_2O_3$) particles, pressing the mixture, and then baking the same.

Specific examples of the materials of the fluorescent plate 21 may include $Al_2O_3$/YAG:Ce, $Al_2O_3$/YAG:Pr, $Al_2O_3$/YAG:Sm and $Al_2O_3$/LuAG:Ce. The doping amounts of the rare earth elements (activators) in such phosphors of the fluorescent plate 21 are approximately 0.5% by mol.

From the viewpoint of the conversion efficiency (quantum yield) of the excitation light to fluorescence and the heat dissipation property, the fluorescent plate 21 may preferably have a thickness of 0.05 to 2.0 mm.

The fluorescent plate 21 may contain a light scatterer that diffuses at least the excitation light, and may have a light diffusion function for diffusing the excitation light. If the light scatterer diffuses the excitation light and fluorescence, the fluorescent plate 21 has a light diffusion function for diffusing the excitation light and fluorescence.

If the fluorescent plate 21 has a light diffusion function, the traveling direction of the excitation light is changed by the light scatterer inside the fluorescent plate 21. This increases the optical path length for converting the excitation light into fluorescence, and the probability for the excitation light to be absorbed into the phosphor portions increases. As a result, the excitation light entering the inside of the fluorescent plate 21 can be effectively used and converted into fluorescence with high efficiency.

If the fluorescent plate 21 has the function of diffusing fluorescence, the traveling direction of fluorescence is changed by the light scatterer inside the fluorescent plate 21. This suppresses the confinement of the fluorescence within the fluorescent plate 21. As a result, the fluorescence emission member 20 can effectively use the fluorescence occurring in the fluorescent plate 21 and emit the fluorescence to outside with high efficiency.

In addition, since the fluorescent plate 21 has the light diffusion function, the thickness of the fluorescent plate 21 can be reduced without the detriment of lowering the conversion efficiency (quantum yield) of the excitation light into fluorescence. If the thickness of the fluorescent plate 21 is reduced in thickness, the fluorescent plate 21 has an extremely high heat dissipation property. In addition, emission of the fluorescence from the outer periphery of the fluorescent plate 21 to outside can be sufficiently suppressed or prevented.

The light scatterer contained in the fluorescent plate 21 is constituted of fine particles or a separated phase of grain boundary having a refractive index different from that of aluminum oxide ($Al_2O_3$) constituting the metal oxide portions of the fluorescent plate 21 or that of the phosphor. Examples of the fine particles constituting the light scatterer may include fine particles of inorganic compounds such as yttria, silicon nitride, aluminum nitride and strontium fluoride.

From the viewpoint of the heat dissipation property and a low stress property, a tin-containing solder may preferably be used as a bonding member constituting the bonding member layer 26.

Specific examples of the tin-containing solder used as the bonding member may include a gold-tin alloy (AuSn, a tin (Sn) content of 20% by mass, a thermal conductivity of 250 W/m·K) and a tin-sliver-copper alloy (Sn-3Ag-0.5Cu (a silver (Ag) content of 3% by mass, a copper (Cu) content of 0.5% by mass, and a tin (Sn) content of 96.5% by mass), a thermal conductivity of 55 W/m·K). Of these, the gold-tin alloy may preferably be used because of the high thermal conductivity and the low tin content. Specifically, if the gold-tin alloy is used as the bonding member, the high thermal conductivity allows a reduction of approximately 20 degrees in the temperature of the fluorescent plate 21 for the same excitation power of excitation light, compared to a case where the tin-silver-copper alloy is used as the bonding member. The low tin content can suppress a drop in the reflectance of a reflection layer 31.

For example, the bonding member layer 26 has a thickness of 30 μm.

In the illustrated example, the fluorescence emission member 20 and the heat dissipation substrate 22 are bonded with the bonding member by using a reflow method. For example, using a reflow furnace, a flux-free solder sheet (bonding member) sandwiched between the fluorescence emission member 20 and the heat dissipation substrate 22 is heated in a formic acid gas atmosphere or hydrogen gas atmosphere. According to such a bonding method of performing reflowing by using reduction power of the formic acid or hydrogen to remove a surface oxide film of the flux-free solder sheet, voids will not occur in the formed bonding member layer 26 and favorable thermal conductivity is obtained.

The heat dissipation substrate 22 dissipates heat occurring in the fluorescence emission member 20 (specifically, the fluorescent plate 21).

The heat dissipation substrate 22 may preferably be made of a material that has high thermal conductivity and between which and the fluorescent plate 21 a difference in the coefficient of thermal expansion is small.

Specifically, the constituent material of the heat dissipation substrate 22 may preferably have a coefficient of thermal expansion higher than or equal to that of the constituent material of the fluorescent plate 21. The difference in the coefficient of thermal expansion may preferably be smaller than or equal to $9 \times 10^{-6}$ [1/K].

Suppose that the difference in the coefficient of thermal expansion between the constituent material of the heat dissipation substrate 22 and that of the fluorescent plate 21 is smaller than or equal to $9 \times 10^{-6}$ [1/K]. If the operating temperature of the fluorescent plate 21 is set to or below 150° C., the bonding temperature of the bonding member (specifically, tin-containing solder) between the fluorescence emission member 20 and the heat dissipation substrate 22 in the manufacturing steps of the fluorescence light source apparatus 10 is approximately 100° C. When the fluorescence light source apparatus 10 is in operation, compressive stress occurs in the fluorescent plate 21. In such a case, exfoliation due to thermal expansion therefore will not occur between the fluorescent plate 21 and the heat dissipation substrate 22.

Metals such as copper (Cu) and an alloy of molybdenum and copper (Mo—Cu) may be used as the constituent material of the heat dissipation substrate 22.

Copper used as the constituent material of the heat dissipation substrate 22 has a coefficient of thermal expansion of $16.5 \times 10^{-6}$ [1/K]. The molybdenum-copper alloy (a copper (Cu) content of 30% by mass) has a coefficient of thermal expansion of $8.6 \times 10^{-6}$ [1/K]. YAG used as the constituent material of the fluorescent plate 21 has a coefficient of thermal expansion of $8.6 \times 10^{-6}$ [1/K].

In the illustrated example, the heat dissipation substrate 22 is made of copper.

The thickness of the heat dissipation substrate 22 may be determined as appropriate in consideration of the heat dissipation characteristic. Examples include 0.5 to 5.0 mm.

From the viewpoint of the heat dissipation property, as illustrated in FIGS. 1 and 2, the front surface of the heat dissipation substrate 22 may preferably have an area greater than that of the back surface of the fluorescent plate 21.

The heat dissipation substrate 22 may also have a function of heat dissipation fins.

In the illustrated example, the heat dissipation substrate 22 has a thickness of 2 mm.

From the viewpoint of bondability to the bonding member layer 26, as illustrated in FIG. 2, a metal film formed by stacking a protective film layer 23 and a solder wet film layer 24 in such order may preferably be formed on the front surface of the heat dissipation substrate 22.

The protective film layer 23 of the metal film is a nickel (Ni) film formed by plating in a Watts bath, for example. The solder wet film layer 24 is a gold (Au) film formed by plating in a Watts bath, for example.

In the illustrated example, the entire outer surfaces (front surface, back surface and peripheral side surfaces) of the heat dissipation substrate 22 are covered with the metal film including the protective film layer 23 and the solder wet film layer 24. As for the thicknesses of the respective layers constituting the metal film, the protective film layer 23 has a thickness of 2.5 µm, and the solder wet film layer 24 has a thickness of 0.03 µm.

The reflection layer 31 of flat plate shape, made of a silver reflection film or a silver alloy reflection film mainly containing silver is provided on the back surface side of the fluorescent plate 21, or more specifically, between the fluorescent plate 21 and the heat dissipation substrate 22 so as to extend along the back surface of the fluorescent plate 21. In other words, the reflection layer 31 is opposed to the back surface of the fluorescent plate 21. The provision of the silver or silver alloy reflection layer 31 having a high reflection property on the back surface side gives the fluorescent plate 21 a high reflection function on the back surface.

In the illustrated example, an enhanced reflection portion 32 including a metal oxide multilayer film is provided between the reflection layer 31 and the fluorescent plate 21, in close contact with the back surface of the fluorescent plate 21. In other words, the enhanced reflection portion 32 and the reflection layer 31 are provided in this order on the back surface of the fluorescent plate 21. The metal oxide multilayer film constituting the enhanced reflection portion 32 includes silicon dioxide ($SiO_2$) layers 32A and a titanium oxide ($TiO_2$) layer 32B. Here, the metal oxide multilayer film constituting the enhanced reflection portion 32 has a thickness of 350 nm. A reflection stack 30 including the silicon dioxide layers 32A and the titanium oxide layer 32B constituting the metal oxide multilayer film is produced by electron beam evaporation. Specifically, stacked films (reflection stack 30) are deposited by electron beam evaporation on the back surface of the fluorescent plate 21 on which a resist patterned by exposure has been disposed. The resist is then lifted off to produce the reflection stack 30. The entire front surface (in FIG. 2, top surface) of the enhanced reflection portion 32 is opposed to and put in contact with a center portion of the back surface of the fluorescent plate 21.

For example, the reflection layer 31 has a thickness of 110 to 350 nm.

From the viewpoint of effective use of the excitation light and fluorescence, the front surface (in FIGS. 1 and 2, top surface) of the reflection layer 31 may preferably have an area smaller than or equal to that of the back surface of the fluorescent plate 21.

In the illustrated example, the front surface of the reflection layer 31 has dimensions slightly smaller than those of the back surface of the fluorescent plate 21. The entire front surface of the reflection layer 31 is opposed to a center portion of the back surface of the fluorescent plate 21.

An adhesion improvement layer 35A is provided on the front surface of the reflection layer 31, in close contact with the front surface so that the entire front surface is covered. An adhesion improvement layer 35B is provided on the back surface (in FIG. 2, bottom surface) of the reflection layer 31, in close contact with the back surface so that the entire back surface is covered.

Since the adhesion improvement layers 35A and 35B are provided on the front and back surfaces of the reflection layer 31, respectively, high adhesion is obtained between the reflection layer 31 and the constituent members of the fluorescence emission member 20 stacked on the reflection layer 31 via the adhesion improvement layers 35A and 35B.

In the illustrated example, the enhanced reflection portion 32 is arranged on and in close contact with the top surface (in FIG. 2, top surface) of the adhesion improvement layer 35A. In other words, the enhanced reflection portion 32 lies between the adhesion improvement layer 35A and the fluorescent plate 21, in close contact with each of the adhesion improvement layer 35A and the fluorescent plate 21. The reflection layer 31, the adhesion improvement layers 35A and 35B and the enhanced reflection portion 32 constitute the reflection stack 30.

The adhesion improvement layers 35A and 35B are made of aluminum oxide ($Al_2O_3$).

The adhesion improvement layers 35A and 35B may preferably have a thickness smaller than or equal to 1 µm.

If the adhesion improvement layers 35A and 35B exceed 1 µm in thickness, the adhesion improvement layers 35A and 35B have low thermal conductivity and the temperature of the fluorescent plate 21 during operation of the fluorescence light source apparatus 10 increases. As a result, a sufficient amount of fluorescence fails to be obtained due to the occurrence of temperature quenching in the phosphor.

In the illustrated example, the adhesion improvement layer 35A has a thickness of 50 nm. The adhesion improvement layer 35B has a thickness of 50 nm.

A sealing layer 37 is provided on the reflection stack 30 so that the back surface and peripheral side surfaces of the reflection layer 31 are covered.

An adhesion layer 38 for bonding the sealing layer 37 to the reflection stack 30 and the fluorescent plate 21 is provided between the reflection stack 30 and the sealing layer 37 and between a peripheral area of the back surface of the fluorescent plate 21 and the sealing layer 37. In other words, the adhesion layer 38 is provided in close contact with the back surface and the peripheral side surfaces of the reflection stack 30, the peripheral area of the back surface of the fluorescent plate 21, and the sealing layer 37.

In such a manner, the sealing layer 37 is provided on the back surface of the fluorescent plate 21, in close contact with the reflection stack 30 via the adhesion layer 38. The sealing layer 37, the adhesion layer 38 and the fluorescent plate 21 forma sealing structure of the reflection stack 30.

The formation of the sealing structure of the reflection stack 30 can prevent exfoliation of the layers constituting the reflection stack 30. The reflection stack 30 can also be prevented from being exposed to an operating environment atmosphere when the fluorescence light source apparatus 10 is in operation. The fluorescence emission member 20 thus has excellent weather resistance and moisture resistance. As a result, the exfoliation of the reflection layer 31 from the fluorescent plate 21 and the surface deterioration of the reflection layer 31 due to oxidation and sulfuration can be prevented.

The formation of the sealing structure of the reflection stack 30 can prevent the reflection stack 30 from being exposed to a manufacturing environment atmosphere in the manufacturing steps of the fluorescence light source apparatus 10, such as the formation process of the fluorescence emission member 20 (specifically, the formation process of the layers constituting the fluorescence emission member 20 after the formation of the sealing structure of the reflection stack 30) and the bonding process of the fluorescence light emission member 20 and the heat dissipation substrate 22. The reflection stack 30 of the fluorescence light source apparatus 10 thus has the intended reflection function.

The sealing layer 37 is made of nickel or indium. From the viewpoint of weather resistance, the sealing layer 37 may preferably be made of nickel.

For example, the sealing layer 37 has a thickness smaller than or equal to 0.5 μm.

The sealing layer 37 is formed by sputter deposition or the like.

In the illustrated example, the sealing layer 37 is made of nickel. The sealing layer 37 has a thickness of 110 nm.

The adhesion layer 38 is made of chromium, a chromium alloy or titanium. In particular, from the viewpoint of adhesion to the sealing layer 37, the adhesion layer 38 may preferably be made of chromium if the sealing layer 37 is made of nickel.

For example, the adhesion layer 38 has a thickness of 50 nm in each of areas between the reflection stack 30 and the sealing layer 37 and between the fluorescent plate 21 and the sealing layer 37.

The adhesion layer 38 is formed by sputter deposition or the like.

In the illustrated diagram, the adhesion layer 38 is made of chromium. An area of the back surface of the fluorescent plate 21 where the adhesion layer 38 is in close contact, i.e., the peripheral area of the back surface of the fluorescent plate 21 has a reflection function because the adhesion layer 38 made of metal is provided in close contact. In other words, the back surface of the fluorescent plate 21 has a high reflection function in the center and a reflection function in the peripheral area. This reduces the absorption of fluorescence in the peripheral area of the back surface of the fluorescent plate 21. The fluorescence occurring in the fluorescent plate 21 can thus be efficiently extracted from the fluorescence emission member 20.

In the fluorescence light source apparatus 10, a diffusion prevention layer 45 is provided on the heat dissipation substrate 22 via the bonding member layer 26. In other words, the fluorescence emission member 20 includes the diffusion prevention layer 34 which is provided on the back surface side of the sealing layer 37, or more specifically, between the sealing layer 37 and the bonding member layer 26.

The provision of the diffusion prevention layer 45 can prevent the metal (specifically, e.g., tin) constituting the bonding member layer 26 from diffusing into the constituent members of the fluorescence emission member 20 stacked on the front surface (in FIGS. 1 and 2, top surface) of the diffusion prevention layer 45 when the fluorescence light source apparatus 10 is in operation. In the manufacturing steps of the fluorescence light source apparatus 10, the metal constituting the bonding member layer 26 can be prevented from diffusing into the constituent members of the fluorescence emission member 20 in the bonding process of the fluorescence emission member 20 and the heat dissipation substrate 22.

The diffusion prevention layer 45 is formed by nickel plating.

Since the diffusion prevention layer 45 is formed by plating, the diffusion prevention layer 45 is denser than when formed by evaporation. This provides an excellent diffusion prevention function.

If the diffusion prevention layer 45 is made of nickel, the diffusion prevention layer 45 can be a plating layer formed by using a nickel sulfamate plating bath, i.e., can be formed by plating in a sulfamate bath. If the diffusion prevention layer 45 is formed by plating in a sulfamate bath, stress acting on the reflection layer 31 from the diffusion prevention layer 45 can be reduced to prevent exfoliation of the reflection layer 31.

If the diffusion prevention layer 45 made of nickel is formed by plating in a sulfamate bath, the stress acting on the reflection layer 31 is 1 to 7 kg/mm$^2$. If the diffusion prevention layer 45 is formed by plating in a Watts bath, the stress acting on the reflection layer 31 is 11 to 13 kg/mm$^2$. If the diffusion prevention layer 45 is formed by plating in a Watts bath, the high stress acting on the reflection layer 31 causes exfoliation at the interface of the reflection layer 31. The diffusion prevention layer 45 therefore may preferably be formed by plating in a sulfamate bath, compared to plating in a Watts bath.

From the viewpoint of reducing the stress acting on the reflection layer 31 from the diffusion prevention layer 45 to prevent exfoliation of the reflection layer 31, the diffusion prevention layer 45 may preferably be formed by plating in a plating bath of high solubility. The diffusion prevention layer 45 may particularly preferably be formed by plating in the foregoing sulfamate bath.

Figure 3:
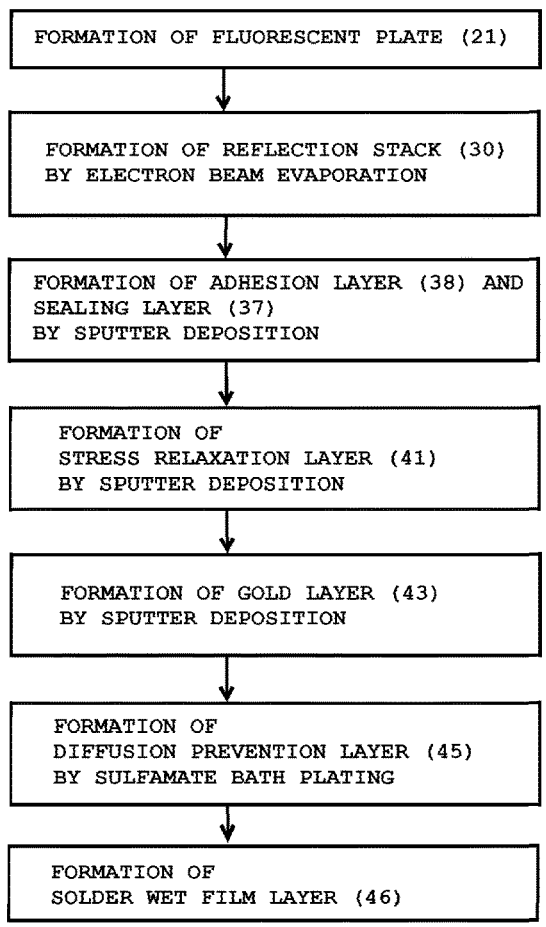
FIG. 3 is a flowchart illustrating a forming process of the fluorescence emission member in the fluorescence light source apparatus of FIG. 1.
Figure 4:
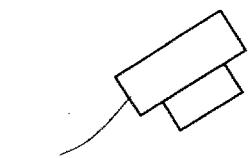
FIG. 4 is an explanatory diagram illustrating an outline of an example of a configuration of a conventional fluorescence light source apparatus.
Figure 4:
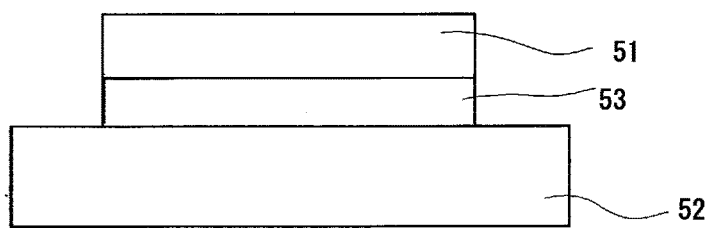
Figure 5:
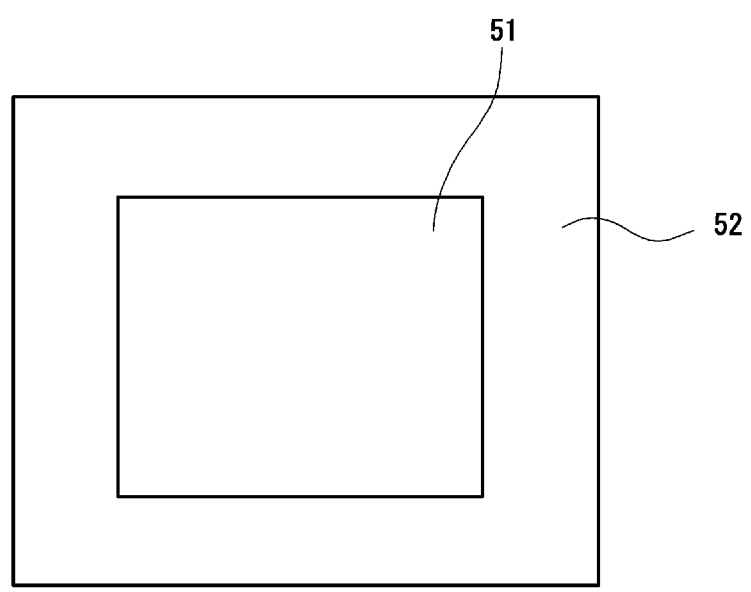
FIG. 5 is an explanatory plan view illustrating a fluorescent plate and a heat dissipation substrate in the fluorescence light source apparatus of FIG. 4.

In the formation process of the fluorescence emission member 20, as illustrated in the flowchart of FIG. 3, the reflection stack 30, the adhesion layer 38, the sealing layer 37 and a stress relaxation layer 41 to be described later may be formed by a dry method before the diffusion prevention layer 45 is formed by plating in a sulfamate bath. In such a case, the fluorescence light source apparatus 10 can provide high emission efficiency over a long period of time. Specifically, the fluorescence light source apparatus 10 may be configured so that the reflection layer 31 has a high reflectance, and the reflectance of the reflection layer 31 will not drop if the operating temperature of the fluorescence emission member 20 (fluorescent plate 21) falls within a temperature range of not lower than 100° C. and not higher than 250° C.

The diffusion prevention layer 45 may preferably have a thickness of not smaller than 1 μm and not greater than 3 μm.

If the diffusion prevention layer 45 has a thickness in the foregoing range, the metal constituting the bonding member layer 26 can be prevented from diffusing into the constituent members of the fluorescence emission member 20 stacked on the front surface of the diffusion prevention layer 45 even if the operating temperature of the fluorescence emission member 20 (fluorescent plate 21) reaches 200° C. to 250° C. (bonding portion temperature reaches 150° C. to 200° C.) when the fluorescence light source apparatus 10 is in operation. Such a thickness can also prevent the occurrence of exfoliation between the fluorescent plate 21 and the adhesion layer 38 and the resulting exfoliation of the reflection layer 31 from the fluorescent plate 21.

On the other hand, if the thickness of the diffusion prevention layer 45 is too large, exfoliation can occur between the fluorescent plate 21 and the adhesion layer 38.

If the thickness of the diffusion prevention layer 45 is too small, the diffusion prevention layer 45 may fail to provide a sufficient diffusion prevention function.

A relationship between the thickness of the diffusion prevention layer 45 formed by nickel plating and a maintenance rate of the reflectance of the reflection layer 31 is shown in Table 1 below. In Table 1, "maintenance rate of reflectance" shows the maintenance rates of the reflectance of the reflection layer 31 after a lapse of 5000 hours with the operating temperature (bonding portion temperature) of the fluorescence emission member 20 at 150° C., 175° C. and 200° C. "Thickness of diffusion prevention layer" shows the thickness of the nickel plating layer formed by plating in a sulfamate bath. "Thickness of surface layer portion" shows the thickness of a portion of the nickel plating layer other than the back surface side where an intermetallic compound is formed, i.e., the thickness of the surface layer portion remaining nickel after the bonding of the fluorescence emission member 20 and the heat dissipation substrate 22.

TABLE 1

| THICKNESS OF DIFFUSION PREVENTION LAYER [μm] | THICKNESS OF SURFACE LAYER PORTION [μm] | MAINTENANCE RATE OF REFLECTANCE | | |
|---|---|---|---|---|
| | | OPERATING TEMPERATURE 150° C. | OPERATING TEMPERATURE 175° C. | OPERATING TEMPERATURE 200° C. |
| NO DIFFUSION PREVENTION LAYER | — | 96% | 93% | 90% |
| 2 | 1 | 100% | 100% | 100% |
| 4 | 3 | 100% | 96% | 91% |

Now, the reason why the thickness of the diffusion prevention layer 45 of not smaller than 1 μm and not greater than 3 μm provides a sufficient diffusion prevention function will be described.

In the formation process of the fluorescence emission member 20, as illustrated in the flowchart of FIG. 3, the diffusion prevention layer 45 including a 2-μm-thick nickel plating layer formed, for example, by plating in a sulfamate bath is formed on the back surface of a gold layer 43 to be described later, stacked on the back surface of the fluorescent plate 21 via the reflection stack 30 and the like. A 0.5-μm-thick solder wet film layer 46 of gold is then formed. In such a manner, the fluorescence emission member 20 is manufactured by stacking the reflection stack 30, the adhesion layer 38, the sealing layer 37, the stress relaxation layer 41 and the gold layer 43 on the back surface of the fluorescent plate 21, and then forming the diffusion prevention layer 45 and the solder wet film layer 46. The bonding member is then sandwiched between the obtained fluorescence emission member 20 and the heat dissipation substrate 22, and bonding is performed by using a reflow furnace. Through such a bonding process, an intermetallic compound (specifically, intermetallic compound mainly containing Sn—Ag—Cu) is formed on the back surface side of the diffusion prevention layer 45 by the diffusion of the metal (specifically, e.g., tin) constituting the bonding member. However, the front surface side (specifically, a 1-μm-thick surface layer portion) of the diffusion prevention layer 45 remains nickel. The front surface side of the diffusion prevention layer 45 provides the diffusion prevention function against the metal constituting the bonding member when the fluorescence light source apparatus 10 is in operation. Even during a high-temperature operation in which the operating temperature of the fluorescence emission member 20 reaches 200° C. to 250° C., the diffusion prevention layer 45 can thus prevent the diffusion of the metal constituting the bonding member layer 26, and the reflection layer 31 can thus maintain a high reflectance.

As illustrated in FIG. 2, the fluorescence emission member 20 may preferably include the stress relaxation layer 41 between the diffusion prevention layer 45 and the sealing layer 37.

The provision of the stress relaxation layer 41 can relax the internal stress occurring in the sealing layer 37. This can prevent the occurrence of exfoliation between the fluorescent plate 21 and the sealing layer 37 and the resulting exfoliation of the reflection layer 31 from the fluorescent plate 21.

In the illustrated example, a 500-nm-thick gold layer 43 formed by sputter deposition is provided on the front surface (in FIG. 2, top surface) of the diffusion prevention layer 45.

The stress relaxation layer 41 is made of a material having a coefficient of thermal expansion approximate to that of the fluorescent plate 21. The stress relaxation layer 41 may include a single layer film made of one type of material. The stress relaxation layer 41 may include a multilayer film including constituent layers made of two or more types of materials.

In the illustrated example, the stress relaxation layer 41 includes a multilayer film including titanium (Ti) layers 41A and 41B and platinum (Pt) layers 42A and 42B. Such layers are each produced by sputter deposition. In the multilayer film, the titanium layer 41A in contact with the sealing layer 37 has a thickness of 50 nm. The platinum layer 42A in contact with the titanium layer 41A has a thickness of 150 nm. The titanium layer 41B in contact with the platinum layer 42A has a thickness of 100 nm. The platinum layer 42B in contact with the titanium layer 41B has a thickness of 200 nm. According to such a multilayer film, the internal stress occurring in the sealing layer 37 can be relaxed since the coefficient of thermal expansion of titanium ($8.5 \times 10^{-6}$ [1/K]) and the coefficient of thermal expansion of platinum ($8.9 \times 10^{-6}$ [1/K]) are approximate to that of YAG ($8.6 \times 10^{-6}$ [1/K]) which is used as the constituent material of the fluorescent plate 21. The platinum layers 42A and 42B provide a diffusion prevention function against the metal (specifically, e.g., tin) constituting the bonding member layer 26. In other words, the platinum layers 42A and 42B also function as diffusion prevention layers along with the diffusion prevention layer 45.

In the fluorescence light source apparatus 10 having such a configuration, the front surface (excitation light incident surface) of the fluorescent plate 21 is irradiated with the excitation light emitted from the excitation light source 11, and the excitation light enters the fluorescent plate 21. In the fluorescent plate 21, the phosphor constituting the fluorescent plate 21 is excited. The phosphor thus emits fluorescence in the fluorescent plate 21. The fluorescence is emitted from the front surface (fluorescence emission surface) of the fluorescent plate 21 to outside and emitted out of the fluorescence light source apparatus 10 along with excitation light that is not absorbed by the phosphor and reflected from the reflection layer 31 at the back surface of the fluorescent plate 21.

In the fluorescence light source apparatus 10, the diffusion prevention layer 45 is formed on the heat dissipation substrate 22 via the bonding member layer 26 on the back surface side of the sealing layer 37. This can prevent the reflectance of the reflection layer 31 from decreasing over time due to the diffusion of the constituent material (bonding member) of the bonding member layer 26 into the reflection layer 31 when the fluorescence light source apparatus 10 is in operation. Even if a tin-containing metal is used as the constituent material of the bonding member layer 26, tin having a low reflectance will not diffuse into the reflection layer 31. The reflectance of the reflection layer 31 can also be prevented from dropping due to the diffusion of the constituent material of the bonding member layer 26 into the reflection layer 31 in the bonding process of the fluorescence emission member 20 and the heat dissipation substrate 22 in the manufacturing steps of the fluorescence light source apparatus 10. The reflection stack 30 of the fluorescence light source apparatus 10 thus has an intended reflection function.

Moreover, in the fluorescence light source apparatus 10, the sealing structure of the reflection stack 30 is formed by the fluorescent plate 21, the sealing layer 37 and the adhesion layer 38. The reflection layer 31 is thereby brought into close contact with the fluorescent plate 21 via the adhesion improvement layer 35A and the enhanced reflection portion 32 on the back surface side of the fluorescent plate 21. In addition, the reflection stack 30 is not exposed to the ambient atmosphere such as the air, or the manufacturing environment atmosphere after the formation of the sealing structure of the reflection stack 30 in the manufacturing steps of the fluorescence light source apparatus 10. This can prevent a drop in the reflectance of the reflection layer 31 due to surface deterioration of the reflection layer 31 by oxidation, sulfuration and the like.

According to the fluorescence light source apparatus 10, high reliability can be obtained without a drop in reflectance over a long period of time.

In the fluorescence light source apparatus 10, the diffusion prevention layer 45 has a thickness of not smaller than 1 μm and not greater than 3 μm. Even if the fluorescence light source apparatus 10 is driven under a driving condition in which the back surface of the fluorescent plate 21 becomes high in temperature, the metal constituting the bonding member layer 26 can thus be prevented from diffusing into the constituent members of the fluorescence emission member 20 stacked on the front surface of the diffusion prevention layer 45. Such a thickness can also prevent the occurrence of exfoliation between the fluorescent plate 21 and the adhesion layer 38 and the resulting exfoliation of the reflection layer 31 from the fluorescent plate 21.

In the fluorescence light source apparatus 10, the diffusion prevention layer 45 is a plating layer formed by using a nickel sulfamate plating bath. This can reduce stress acting on the reflection layer 31 from the diffusion prevention layer 45 and can thus prevent exfoliation of the reflection layer 31.

In the fluorescence light source apparatus 10, the provision of the stress relaxation layer 41 in the fluorescence emission member 20 relaxes internal stress occurring in the sealing layer 37. This can prevent the occurrence of exfoliation between the fluorescent plate 21 and the sealing layer 37 and the resulting exfoliation of the reflection layer 31 from the fluorescent plate 21.

The fluorescence light source apparatus according to the present invention has been described above by using a specific example. However, the fluorescence light source apparatus according to the present invention is not limited thereto.

For example, a periodic structure including a periodic array of a plurality of protrusions may be formed on the front surface of the fluorescent plate. For example, the periodic structure on the front surface of the fluorescent plate is a two-dimensional periodic array of closely packed protrusions having a substantially conical shape (specifically, a conical shape or a truncated conical shape). From the viewpoint of ease of manufacturing, if the fluorescent plate has a periodic structure on its front surface, the fluorescent plate may include a fluorescent member and a periodic structure layer that has optical transparency to the excitation light and the fluorescence.

The structure of the entire fluorescence light source apparatus is not limited to that illustrated in FIG. 1, and various configurations may be adopted. For example, while the fluorescence light source apparatus according to FIG. 1 uses the light of one excitation light source (for example, semiconductor laser), there may be a plurality of excitation light sources. A condenser lens may be disposed in front of the fluorescence emission member to irradiate the fluorescence emission member with the condensed light. The excitation light is not limited to the light of a semiconductor laser. Condensed light of LEDs may be used and light from a lamp filled with mercury, xenon or the like may be used as long as the phosphor in the fluorescent plate can be excited. If a light source having a spread of radiation wavelengths, like a lamp and an LED, is used, the wavelength of the excitation light refers to a region of main radiation wavelengths. However, the present invention is not limited thereto.

REFERENCE SIGNS LIST 10 fluorescence light source apparatus
11 excitation light source
20 fluorescence emission member
21 fluorescent plate
22 heat dissipation substrate
23 protective film layer
24 solder wet film layer
26 bonding member layer
30 reflection stack
31 reflection layer
32 enhanced reflection portion
32A silicon dioxide layer
32B titanium oxide layer
35A, 35B adhesion improvement layer
37 sealing layer 38 adhesion layer
41 stress relaxation layer
41A, 41B titanium layer
42A, 42B platinum layer
43 gold layer
45 diffusion prevention layer
46 solder wet film layer
51 fluorescent plate
52 heat dissipation substrate
53 bonding member layer

The invention claimed is:

1. A fluorescence light source apparatus comprising: a fluorescent plate that emits fluorescence under excitation light and has a front surface serving as an excitation light incident surface; a reflection layer that is disposed on a back surface side of the fluorescent plate; and a heat dissipation substrate, wherein a sealing layer covering a back surface and a peripheral side surface of the reflection layer is provided in close contact with a peripheral area of the back surface of the fluorescent plate via an adhesion layer, and a diffusion prevention layer formed by nickel plating is provided on the heat dissipation substrate via a bonding member layer.

2. The fluorescence light source apparatus according to claim 1, wherein the diffusion prevention layer has a thickness of not smaller than 1 µm and not greater than 3 µm.

3. The fluorescence light source apparatus according to claim 1, wherein the diffusion prevention layer is a plating layer formed by using a nickel sulfamate plating bath.

4. The fluorescence light source apparatus according to claim 1, wherein a stress relaxation layer is provided between the diffusion prevention layer and the sealing layer.

* * * * *